(12) United States Patent  (10) Patent No.: US 7,705,437 B2
Kimura  (45) Date of Patent: Apr. 27, 2010

(54) SEMICONDUCTOR DEVICE

(75) Inventor: Naoto Kimura, Fukuoka (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/285,763

(22) Filed: Oct. 14, 2008

(65) Prior Publication Data

US 2009/0096074 A1  Apr. 16, 2009

(30) Foreign Application Priority Data

Oct. 16, 2007  (JP)  ............................. 2007-268735

(51) Int. Cl.
*H01L 23/495* (2006.01)
(52) U.S. Cl. ...................... 257/676; 257/783
(58) Field of Classification Search ................. 257/783, 257/787, 666, 676, 782
See application file for complete search history.

(56) References Cited

U.S. PATENT DOCUMENTS

| 5,429,992 | A | | 7/1995 | Abbott et al. | |
|---|---|---|---|---|---|
| 5,444,301 | A | * | 8/1995 | Song et al. | ................. 257/737 |
| 5,633,528 | A | | 5/1997 | Abbott et al. | |
| 7,541,667 | B2 | * | 6/2009 | Miyaki et al. | ................. 257/676 |
| 2003/0001289 | A1 | * | 1/2003 | Yamada et al. | ................. 257/783 |
| 2004/0178511 | A1 | * | 9/2004 | Cheng et al. | ................. 257/783 |
| 2008/0265440 | A1 | * | 10/2008 | Mahler | ....................... 257/783 |
| 2008/0296783 | A1 | * | 12/2008 | Enomoto | .................... 257/783 |
| 2009/0108422 | A1 | * | 4/2009 | Sasaki et al. | ................. 257/670 |

FOREIGN PATENT DOCUMENTS

| JP | 3-22465 | 1/1991 |
|---|---|---|
| JP | 7-321280 | 12/1995 |
| JP | 2005-109007 A | 4/2005 |

* cited by examiner

*Primary Examiner*—S. V Clark
(74) *Attorney, Agent, or Firm*—McGinn IP Law Group, PLLC

(57) ABSTRACT

Disclosed herewith is a semiconductor device, which includes a semiconductor chip; a lead device that includes an island for mounting the semiconductor chip and having an area smaller than that of the semiconductor chip at its contact surface, as well as plural hanging leads for supporting the island and coming in contact partially with the semiconductor chip; a mounting material provided on a contact surface between each of the island and hanging leads and the semiconductor chip so as to adhere the semiconductor chip to the island and the hanging leads; and sealing resin for sealing the semiconductor chip. The modulus of elasticity of the mounting material is lower than that of the sealing resin. The mounting material is further coated on the back surfaces of the contact surfaces of the island and the hanging leads.

7 Claims, 4 Drawing Sheets

SEMICONDUCTOR DEVICE

FIELD OF THE INVENTION

The present invention relates to a semiconductor device.

BACKGROUND OF THE INVENTION

The patent document 1 (JP-A-HEI03-022465) discloses a resin sealing type semiconductor device having a semiconductor element (chip) sealed with resin. In the configuration of this semiconductor device, the semiconductor element is mounted on an island larger in size than the semiconductor element. In this case, both the front surface of the semiconductor element and the back surface of each lead frame disposed on the island are coated with a polyimide-based resin film having a thickness of 5 to 100 μm so as to give favorable adherence to both the sealing resin and the semiconductor element/lead frames and absorb the stress to be generated between the sealing resin and each of the semiconductor element/lead frames.

However, if the surface of the semiconductor element is also coated with a polyimide-based resin film in such a way according to the technique as disclosed in the patent document 1, the manufacturing cost rises. Furthermore, if the island is larger in size than the chip and polyimide-based resin is to be coated all over the back surface of the island, the resin coating will have to be made on a wider area, thereby the manufacturing cost further rises.

In recent years, there have come to be employed semiconductor devices in which the lead frames are disposed in a chip area that is smaller in size than the chip. If the lead frames disposing area on the chip is smaller than the chip in such a way, semiconductor devices will come to be able to correspond to chips in various sizes and mount those chips with use of only one type of lead frames. Furthermore, lead frames can be used commonly among those chips, thereby the lead frame material cost is reduced and accordingly the manufacturing cost of the semiconductor device is reduced. And the coating amount of the mounting material required between the lead frames disposing area on the subject chip and the chip itself is required less, thereby the mounting material and the manufacturing cost can be reduced. These are the merits of those semiconductor devices.

The patent document 2 (JP-A-2005-109007) also discloses a semiconductor device in which a semiconductor chip and its leads are overlapped with each other and part of each lead is positioned under the semiconductor chip. The semiconductor chip is adhered not only to a tab where the chip is mounted, but also to an island provided for the hanging leads connected to the tab with an adhesive material.

On the other hand, the patent document 3 (JP-A-HEI07-321280) discloses a die pad having a cross-shaped chip adhering surface. The chip adhering surface is smaller than the subject chip, so the surrounding surface of the chip is practically exposed when the chip is adhered to the adhering surface.

SUMMARY OF THE INVENTION

If a semiconductor device has a large output, the semiconductor uses a lead frame material such as copper or the like having high thermal conductivity so as to form an island with high heat radiation. The linear expansion rate of silicon used for a semiconductor element (chip) is about 3 ppm, that of the copper islands is about 17 ppm, and that of the epoxy sealing resin is about 10 ppm. As disclosed in the patent document 1, if the island is larger than the object chip in size, the sealing resin linear expansion rate is never affected by the silicon. This is because the sealing resin never comes in contact with the silicon directly. On the other hand, the island copper material is affected by the silicon, thereby the apparent linear expansion rate is slightly reduced. Consequently, the difference between the linear expansion rates of the island and the sealing resin is reduced, thereby the island and the sealing resin are not separated so easily. Furthermore, because the modulus of elasticity of the epoxy material is small, the epoxy material is deformed to absorb the stress to be generated. Thus the silicon and the copper material are also not separated so easily. Therefore, it is not required to coat the epoxy resin on the back surface of the island.

If the island is smaller than the semiconductor chip, however, the sealing resin comes in contact with the semiconductor chip directly. And if the sealing resin comes in contact with the silicon of the semiconductor chip directly in such a way, the resin shrinkage is affected by the linear expansion rate of the silicon and accordingly the linear expansion rate of the resin goes lower than its original one. Consequently, the linear expansion rate comes to differ between the copper material and the resin and the linear expansion rate rises more than the actual one (17−10=7 ppm usually). As a result, the copper material is separated from the resin under the island and the separation is accelerated by, for example, the temperature cycle, thereby causing cracks in the resin and the cracks are extended outside the package. This has been a conventional problem.

Under such circumstances, it is an object of the present invention to provide a semiconductor device that includes a semiconductor chip; a lead device that includes an island for mounting the semiconductor chip and has an area smaller than the semiconductor chip at its contact surface, as well as plural hanging leads supporting the island and coming in contact partially with the semiconductor chip; a mounting material provided on a contact surface between each of the island and hanging leads and the semiconductor chip and used to adhere the semiconductor chip to the island and the hanging leads; and sealing resin for sealing the semiconductor chip.

The mounting material is lower than the sealing resin in the modulus of elasticity and the mounting material is also coated on the back surfaces of the contact surfaces between each of the island and hanging leads and the semiconductor chip.

Because the mounting material is provided between each of the island and hanging leads that are included in the lead device and the sealing resin and the modulus of elasticity of the mounting material is lower than that of the sealing resin, the stress to be generated by the difference of the linear expansion rate between the lead device and the sealing resin is eased, thereby their separation can be prevented. Furthermore, because the mounting material is just provided on the island that is smaller in area than the semiconductor chip and on the hanging leads, the amount of the mounting material to be coated, as well as the manufacturing cost of the semiconductor device can be reduced, respectively.

Combinations of the above components, representations of the present invention, etc. can also be changed for other methods, devices, etc. as the embodiment of the present invention.

According to the present invention, it is therefore possible to provide a technique that can prevent the separation between the lead device and the sealing resin while reducing the manufacturing cost of the semiconductor device.

DETAILED DESCRIPTION OF THE PREFERRED EMBODIMENTS

Figure 1:
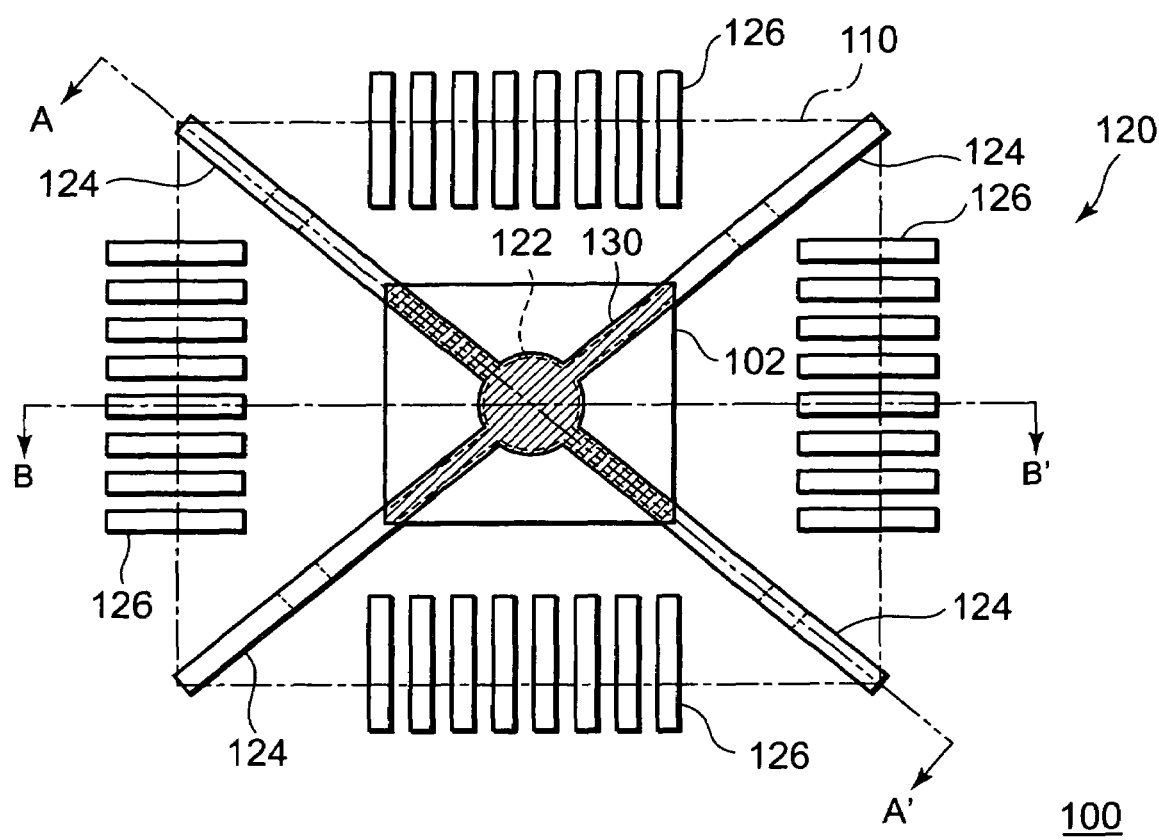
FIG. 1 is a bottom view for showing a configuration of a semiconductor device in an embodiment of the present invention.

Hereunder, the embodiments of the present invention will be described with reference to the accompanying drawings. In all of those drawings, same reference numerals will be used for same components, avoiding redundant description.

Figure 2:
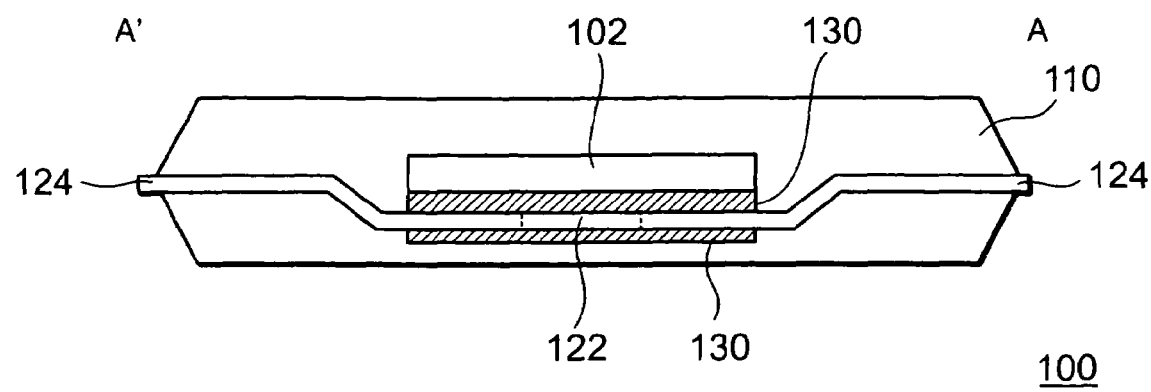
FIG. 2 is a cross sectional view taken on line A-A' of FIG. 1.
Figure 3:
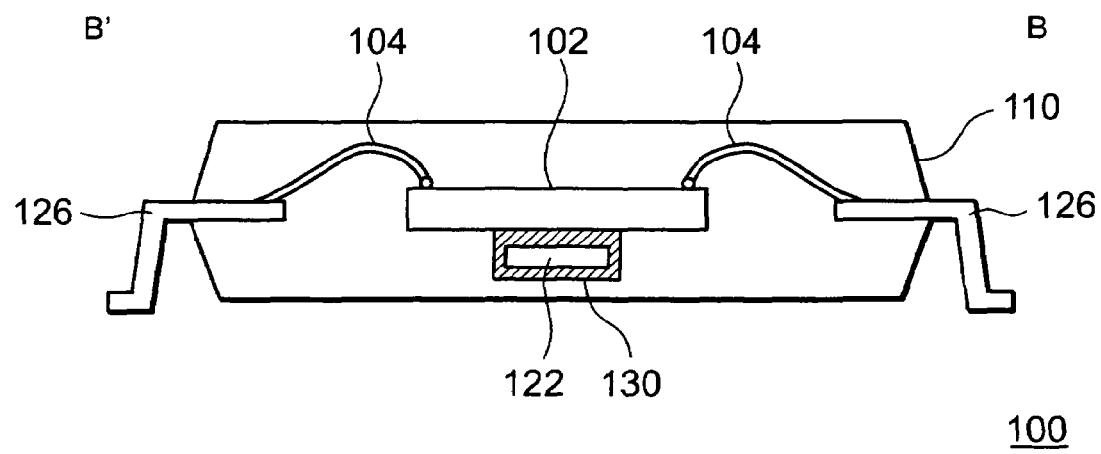
FIG. 3 is a cross sectional view taken on line B-B' of FIG. 1.

FIG. 1 shows a bottom view of a configuration of a semiconductor device in an embodiment of the present invention. FIG. 2 shows a cross sectional view taken on line A-A' of FIG. 1. FIG. 3 shows a cross sectional view taken on line B-B' of FIG. 1. The bottom view shown in FIG. 1 is taken from the lower side in FIGS. 2 and 3.

The semiconductor device 100 includes a semiconductor chip 102; a lead device 120 consisting of an island 122 for mounting the semiconductor chip 102, plural hanging leads 124, and plural external leads 126; a mounting material 130 provided on a contact surface between each of the island 122 and hanging leads 124 and the semiconductor chip 102 and used to adhere the semiconductor chip 102 to the island 122 and the hanging leads 124; plural wires 104 for connecting the semiconductor chip 102 to the external leads 126 electrically; and sealing resin 110 for sealing the semiconductor chip 102. In addition to the surfaces coming in contact with the semiconductor chip 102, the mounting material 130 is also coated on the back and side surfaces of the island 122 and hanging leads 124. In this embodiment, the mounting material 130, at a top view, is coated selectively on the back and side surfaces of the hanging leads 124 in a region where the semiconductor chip 102 and the hanging leads 124 are superposed with each other. The sealing resin 110 also seals the back surfaces of the island 122 and hanging leads 124 on which the mounting material is coated selectively. The semiconductor chip 102 includes a multilayer wiring structure formed on the silicon substrate, and other items. The silicon substrate forms the surface of the semiconductor chip, which comes in contact with the island 122. In FIG. 1, the sealing resin 110 is shown with a broken line.

In this embodiment, the lead device 120 has four hanging leads 124, each being shaped as a thin long rectangle. The four hanging leads 124 are extended from the four corners of the package enclosed by the sealing resin 110 to the island 122 positioned almost in the center of the package. One end of each hanging lead 124 is connected to the island 122 where it is superposed with the semiconductor chip 102. As shown in FIG. 1, in this embodiment, the island 122 is smaller than the semiconductor chip 102 in their common contact surface. Consequently, as described above, each hanging lead 124 comes in contact partially with the semiconductor chip 102. The island 122 is formed so as to come in contact with the semiconductor chip 102 almost in the center of the chip 102. In this example, the island 122 is formed like a disc. Consequently, the island 122 can disperse a tensile stress to be generated evenly, thereby preventing the separation between the lead device and the sealing resin to be caused by the generated tensile stress.

Although not shown, before the semiconductor device 100 is transformed into a chip, the other end of each hanging lead 124 is connected to a lead frame of the lead device 120 and further to an external lead 126 through the lead frame. The lead device 120 can be configured with, for example, a copper material.

The sealing resin 110 can be, for example, epoxy resin (e.g., the modulus of bending elasticity (room temperature) =19.6 GPa, linear expansion rate (room temperature)=10 ppm, glass transition temperature=125° C.). The mounting material 130 can be any of the materials having an elasticity rate smaller than that of the sealing resin 110. The mounting material can be epoxy resin containing, for example, rubber components. Concretely, the mounting material can be epoxy resin in which the rubber component micro particles are dispersed. The rubber components may be acrylic rubber, butyl rubber, etc. As an example, it is possible to use a material consisting of acrylic rubber and epoxy resin (e.g., flexural modulus of elasticity (room temperature=2.6 Gpa, linear expansion rate (room temperature)=56 ppm, glass transition temperature=32° C. (EN4900 (Hitachi Chemical Industrial Materials Co., Ltd.)). Furthermore, the mounting material can be any of the materials having a linear expansion rate higher than that of the sealing resin 110.

As described above, if epoxy resin is used as the sealing resin 110, the linear expansion rate is about 10 ppm. The linear expansion rate of the silicon used to form the semiconductor chip 102 is about 3 ppm, which is much lower than that of the epoxy resin. On the other hand, the linear expansion rate of the copper material used to form the island 122 is about 17 ppm, which is much higher than that of the epoxy resin. If the island 122 is smaller in size than the semiconductor chip 102 just like the semiconductor device in this embodiment, the semiconductor chip 102 comes in contact with the sealing resin 110 directly. Consequently, the shrinkage of the sealing resin 110 is affected by the linear expansion rate of the silicon, thereby the apparent linear expansion rate of the sealing resin 110 becomes lower than the original linear expansion rate of the sealing resin 110. As a result, the linear expansion rate comes to differ significantly between the island 122 and the sealing resin 110, so a tensile stress is generated between the island 122 and the sealing resin 110, thereby causing them to be separated easily.

In this embodiment, in addition to the surfaces of the island 122 and the hanging leads 124, which are in contact with the semiconductor chip 102 respectively, the mounting material 130 is also coated on their back and side surfaces. This means that the mounting material 130 is coated selectively on the back and side surfaces of the contact surfaces of the island 122 and the hanging leads 124, which come in contact with the semiconductor chip 102 respectively. With this configuration, the mounting material 130 provided between the copper material used to form the island 122 and the hanging leads 124 and the sealing resin 110 comes to prevent the direct contact with the sealing resin 110 in the region where the semiconductor chip 102 and the sealing resin 110 come in contact with each other. If the modulus of elasticity of the mounting material 130 is low, it is possible to reduce the tensile stress to be generated by the difference of the linear expansion rate between the sealing resin 110 and each of the island 122 and hanging leads 124. This is because the sealing resin 110 can ease the internal stress to be caused by the difference of the length of the shrinkage, which is generated by the difference of the linear coefficient between the sealing resin 110 and each of the island 122 and hanging leads 124. This is why the present invention can avoid the above-described separation that might otherwise occur between the sealing resin 110 and each of the island 122 and hanging leads 124.

Furthermore, in this embodiment, the area of the island 122 is smaller than that of the semiconductor chip 102 and the total area of the island 122 and hanging leads 124 is smaller than the area of the semiconductor chip 102. And the mounting material 130 is coated selectively on the back and side surfaces of a portion where each of the island 122 and hanging leads 124 comes in contact with the semiconductor chip 102, so the amount of the mounting material 130 to be coated can be reduced, thereby the manufacturing cost of the semiconductor device can be reduced.

Figure 4:
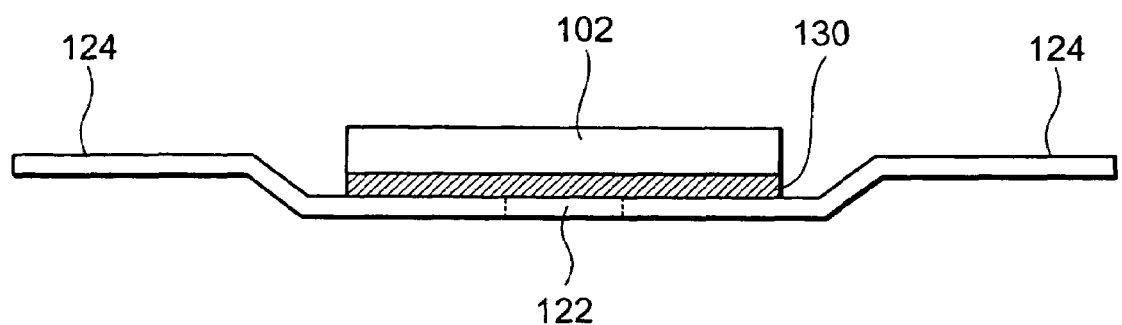
FIG. 4 is another cross sectional view for showing the configuration of the semiconductor device in a manufacturing process in the embodiment of the present invention.
Figure 5:
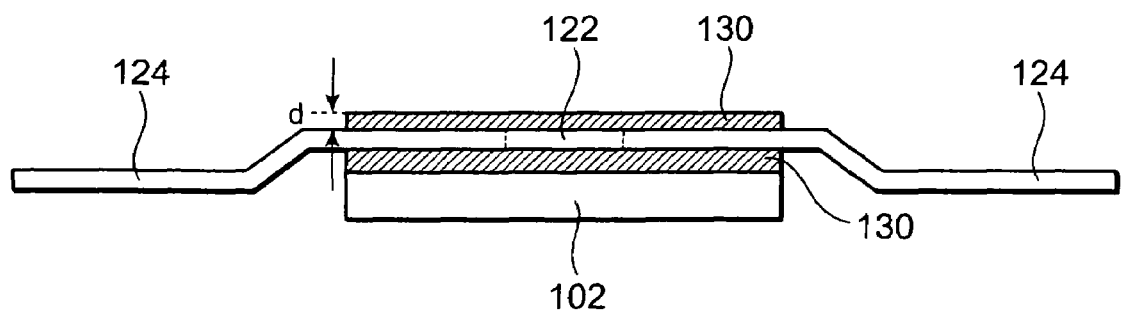
FIG. 5 is a cross sectional view for showing the configuration of the semiconductor device in another manufacturing process in the embodiment of the present invention.

Next, there will be described how to manufacture the semiconductor device 100 in this embodiment with reference to FIGS. 4 and 5. FIGS. 4 and 5 are cross sectional views for showing the configuration of the semiconductor device in intermediate manufacturing processes. At first, as shown in FIG. 4, the mounting material 130 is coated on each of the island 122 and hanging leads 124 of the lead device, then the semiconductor chip 102 is mounted thereon to be adhered to the island 122 and the hanging leads 124 respectively. Although not limited specially here, the size of the island 122 can be determined as, for example, about 3.5 mm in diameter. The mounting material to be coated between each of the island 122 and hanging leads 124 and the semiconductor chip 102 can be about 20 μm in thickness.

After that, the lead device on which the semiconductor chip 102 is mounted is turned over and the mounting material 130 is coated on the back surfaces of each of the island 122 and hanging leads 124 that come to be superposed on the semiconductor chip 102 respectively. At this time, the mounting material 130 can also be coated on the side surfaces of the island 122 and hanging leads 124. And the thickness d of the mounting material to be coated on the back and side surfaces of the island 122 and hanging leads 124 can be thinner than that of the mounting material 130 to be coated on the surfaces of the island 122 and hanging leads 124. For example, if the diameter of the mounting material 130 is about 3.5 mm, the thickness d of the mounting material 130 to be coated on the back and side surfaces of the island 122 and hanging leads 124 can be less than 5 μm. Even this thickness can ease the tensile stress, thereby preventing the separation between the lead device and the sealing resin, since the island 122 is small in size and the mounting material 130 is small in modulus of the elasticity.

After that, the mounting material 130 is heated in an oven to give it predetermined adhesion. Then, the semiconductor chip 102 and the external leads 126 are wired with wires 104, then the surface is sealed with the sealing resin 110. After that, the external leads 126 are molded to complete the package.

Figure 6:
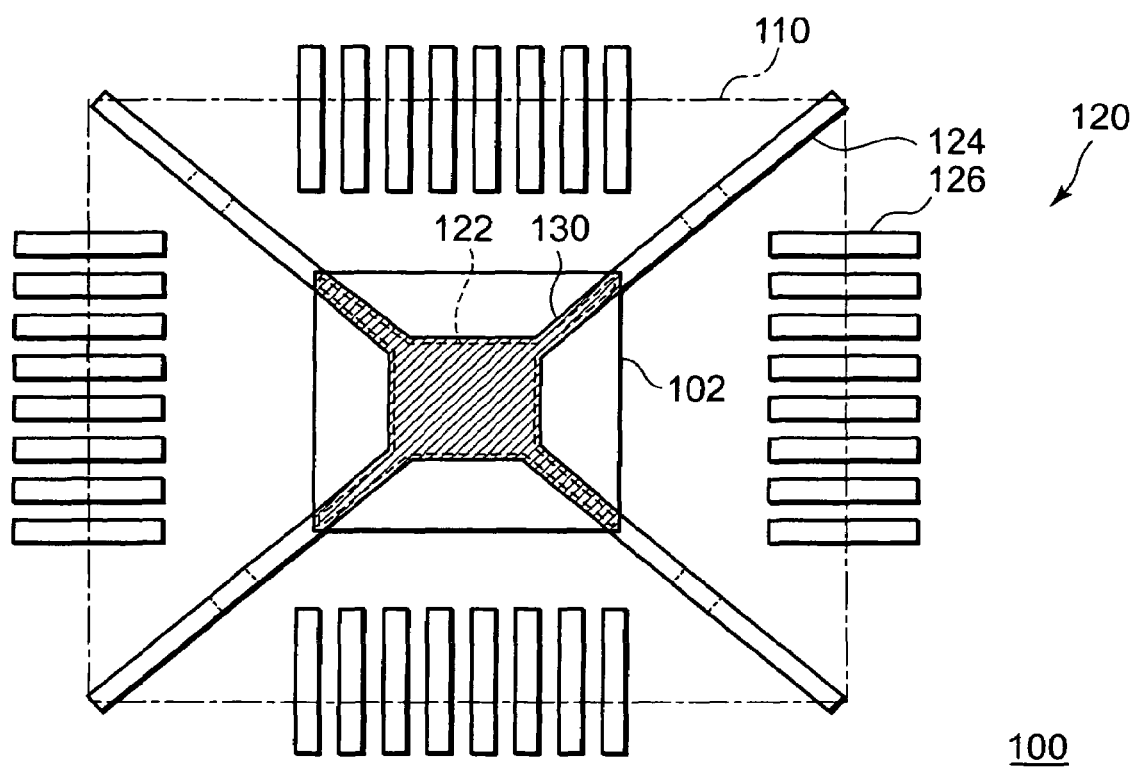
FIG. 6 is a bottom view for showing another configuration of the semiconductor device in the embodiment of the present invention.

FIG. 6 is a bottom view for the configuration of the semiconductor device 100 shown in FIG. 1 in another example.

Here, the island 122 is shaped as a rectangle (square). This is only a difference from the configuration shown in FIG. 1. Because the island 122 is shaped as a rectangle, a cutting metal mold used for manufacturing the lead frames by pressing can be manufactured easily. The shapes of items other than the island 122 are all the same as those of the semiconductor device 100 shown in FIG. 1, so the description for them will be omitted here. The shape of the island 122 may not be circle nor rectangle; they can be determined freely.

While the preferred forms of the present invention have been described, it is to be understood that modifications will be apparent to those skilled in the art without departing from the spirit of the invention.

For example, in the embodiment described above, the mounting material 130 is also coated selectively on the back and side surfaces of the island 122 and hanging leads 124. However, it is possible to omit the coating of the mounting material 130 on the side surfaces of the island 122 and hanging leads 124. In this case, the amount of the mounting material 130 to be coated can be reduced, thereby the manufacturing cost of the semiconductor device can further be reduced. Even in this case, because the contact area between each of the side surfaces of the island 122 and hanging leads 124 and the sealing resin 110 is much smaller than that of the back surfaces, separation and cracks of resin will hardly occur on those side surfaces.

What is claimed is:

1. A semiconductor device, comprising:
   a semiconductor chip;
   a lead device that includes an island for mounting the semiconductor chip and having an area smaller than the semiconductor chip at its contact surface, as well as a plurality of hanging leads for supporting the island and coming in contact partially with the semiconductor chip;
   a mounting material provided on the contact surface between each of the island and hanging leads and the semiconductor chip and used to adhere the semiconductor chip to the island and the hanging leads; and
   sealing resin for sealing the semiconductor chip,
   wherein the modulus of elasticity of the mounting material is lower than that of the sealing resin, and
   wherein the mounting material is further coated on the back surfaces of the contact surfaces of the island and hanging leads.

2. The semiconductor device according to claim 1, wherein the sealing resin further seals the back surfaces of the island and the hanging leads coated with the mounting material, respectively.

3. The semiconductor device according to claim 1, wherein the mounting material that seals the back surfaces of the island and the hanging leads is thinner than that coated on the contact surfaces.

4. The semiconductor device according to claim 1, wherein the mounting material that seals the back surfaces of the island and hanging leads is less than 5 μm in thickness.

5. The semiconductor device according to claim 1, wherein the mounting material is also coated on the side surfaces of the contact surfaces of the island and hanging leads.

6. The semiconductor device according to claim 5, wherein the mounting material coated on the back surfaces of the island and hanging leads is thinner than that coated on their contact surfaces.

7. The semiconductor device according to claim 5, wherein the mounting material coated on the side surfaces of the side surfaces of the island and hanging leads is less than 5 μm in thickness.

* * * * *